United States Patent [19]

Reichardt

[11] Patent Number: 4,668,033
[45] Date of Patent: May 26, 1987

[54] CIRCUIT BOARD WITH INTEGRAL CONNECTOR

[75] Inventor: Manfred Reichardt, Weinsberg, Fed. Rep. of Germany

[73] Assignee: Allied Corporation, Morris Township, Morris County, N.J.

[21] Appl. No.: 818,158

[22] Filed: Jan. 13, 1986

[30] Foreign Application Priority Data

Jan. 19, 1985 [DE] Fed. Rep. of Germany ....... 3501711

[51] Int. Cl.⁴ ............................................. H01R 9/09
[52] U.S. Cl. ................................................. 339/17 LC
[58] Field of Search .......... 339/17 L, 17 LM, 17 LC, 339/17 M, 17 R, 176 MP

[56] References Cited

U.S. PATENT DOCUMENTS

| | | | |
|---|---|---|---|
| 3,160,455 | 12/1964 | Mayon et al. | 339/17 L |
| 3,278,714 | 10/1966 | Bernutz | 339/17 L |
| 3,413,594 | 11/1968 | Fernald | 339/17 LC |
| 4,252,393 | 2/1981 | Johnson | 339/75 MP |
| 4,418,972 | 12/1983 | Benasutti | 339/207 R |
| 4,475,781 | 10/1984 | Asick et al. | 339/17 LM |
| 4,518,211 | 5/1985 | Stepan et al. | 339/17 LM |

FOREIGN PATENT DOCUMENTS

| | | | |
|---|---|---|---|
| 2615300 | 10/1976 | Fed. Rep. of Germany | 339/176 MP |
| 3000229 | 7/1980 | Fed. Rep. of Germany | . |
| 3222178 | 12/1983 | Fed. Rep. of Germany | . |
| 3134278 | 3/1986 | Fed. Rep. of Germany | 339/17 LC |
| 274812 | 9/1964 | Netherlands | 339/176 MP |

OTHER PUBLICATIONS

Microcomputing, B and B Wiring Adapter, pp. 16, 20; 2-1984.

*Primary Examiner*—Neil Abrams
*Attorney, Agent, or Firm*—Roger H. Criss

[57] ABSTRACT

A printed circuit board 1 formed of plastic material, with an upper surface 9, a bottom surface 10 and a plurality of side edges, with conductive paths 11 being provided on the upper surface 9 and/or bottom surface 10 to electrically connect the components to be mounted on such surface. A connector 2 having an insulating body 4 is provided on the circuit board 1 and in which reside contact elements 5 with terminal ends 13 and contact ends 12. The terminal ends 13 are in electrical connection with predetermined conductive paths 11 for providing a connection to the outside of the board. The circuit board 1 and the insulating body 4 of the connector 2 are integrally formed.

18 Claims, 10 Drawing Figures

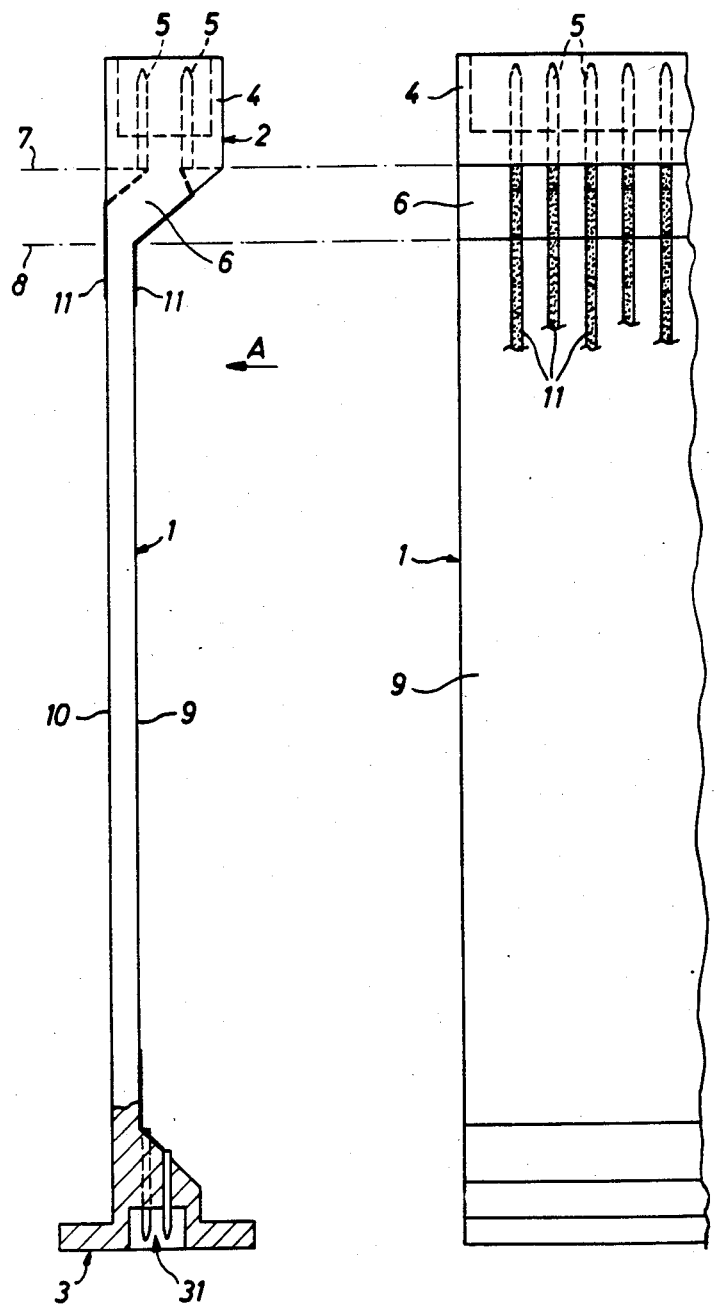

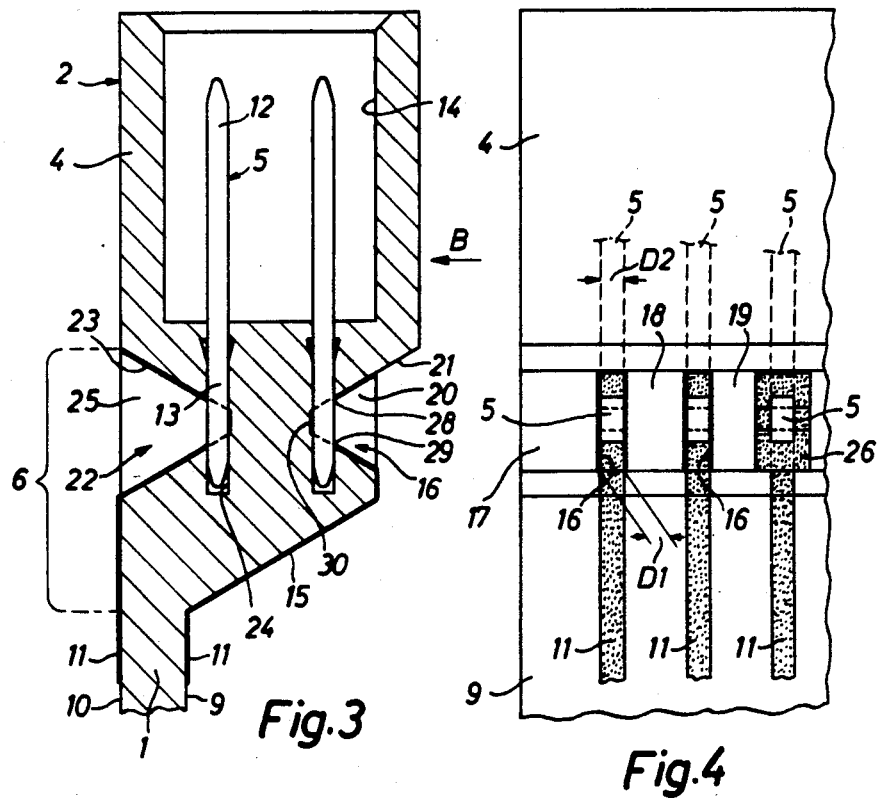
Fig.3
Fig.4
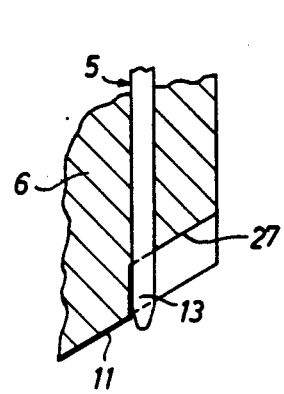
Fig.6
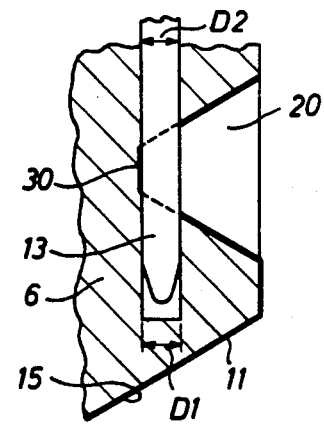
Fig.5

CIRCUIT BOARD WITH INTEGRAL CONNECTOR

BACKGROUND OF THE INVENTION

1. Field of the Invention

This invention relates to a printed circuit board.

2. Description of the Prior Art

Circuit boards are used in engineering to a great extent. They support on their upper and/or lower surfaces components for certain electrical circuits. Each circuit board is usually connected mechanically and electrically to other components. For this purpose, the circuit board supports almost always a connector adjacent to one of its edges. The connector generally has an insulating body, also called a housing, which is fastened to the circuit board. The insulating body is often screwed to the circuit board, the screws going through holes in the insulating body and holes in the circuit board aligned with the former. The contact elements in the insulating body are often connected in that the terminal ends of the contact elements are plugged into holes penetrating the circuit board, the conductive paths to be led out terminating at these holes. The terminating ends located in the holes are additionally soldered. It is also known already to have the terminal ends of the contact elements terminate near the circuit board surface so that the ends can be soldered to soldering points provided at the surface, these soldering points in turn forming the ends of the conductive paths to be led out.

In the surface mounted components technique also used nowadays, components are provided directly on the surface of a circuit board or printed circuit so that an insertion into predrilled holes is no longer necessary. Especially in circuit boards for this technique, no soldering holes for the accommodation of the terminal ends of the contact elements are provided any more so that the coordination between the connector connection and conductive paths depends upon the dimensional accuracy of the connector and of the circuit board. At the typical pitch dimensions of 1.27 mm this means that a slightly bent terminal end will lead to miscontacting. Another error source is the difference in the thermal expansion of the connector to be fastened and the circuit board during the soldering operation, i.e., when the terminal ends of the contact elements are to be soldered to the circuit board. The differing thermal expansions can cause the terminal ends or solder connections of the contact elements to not sit accurately on the associated terminal point on the circuit board any more.

In addition to the already discussed problems in connecting the contact elements electrically to the conductive paths, there is also the necessity of fastening the insulating body of the connector mechanically to the circuit board. This requires assembly holes, as already mentioned above. It would be extremely advantageous if the insulating body could be attached to the circuit board without the use of an assembly hole. This would be of particular advantage for the surface mount technique because it does away with soldering holes so that, if no assembly holes were required for the connector either, no holes at all would be needed in the circuit board.

It would be desirable to avoid the disadvantages of the state of the art, and in particular, to provide a circuit board equipped with a connector without requiring assembly holes in the circuit board and/or the connector. Also, it would be desirable to provide a precise connection of the contact elements of the connector to the conductive paths to be led out. Further, it would be desirable to avoid miscontacting, in particular also due to different coefficients of thermal expansion of the connector and circuit board.

SUMMARY OF THE INVENTION

In accordance with this invention, there is provided a printed board made of plastic material comprising an upper surface, a bottom surface, a plurality of side edges, electrically conductive paths provided on the upper surface and/or bottom surface and adapted for providing an electrical connection between electrical components which can be located at the surfaces, and a connector which comprises an insulating body provided at the printed board, the connector having contact elements which are provided with contact ends and terminating ends, the terminating ends being adapted to be in an electrically conducting connection with predetermined conductive paths for providing a connection to the outside of the printed board, characterized in that the printed board and a terminating means associated with the insulating body and adapted to receive the contact elements are integrally formed. Preferably, the printed board and the insulating body of the connector are integrally formed.

According to one preferred embodiment example of the invention, a connecting element of single-piece design is provided between circuit board and insulating body in order to lead out of their associated planes defined by the top side and bottom side of the circuit board at least a part of the conductive paths to be connected to the connector, thereby establishing the connection to the contact elements of the connector in an efficient manner.

According to one embodiment example of the invention, it is provided in this context that the connector is not designed to be directly an integral part of the circuit board, but that instead of the insulating body a coupling part and the circuit board form one integral part, this coupling part then leading out of their associated planes of the top and bottom surfaces of the circuit board those conductive paths which are to be led out, thereby permitting their connection to the contact elements disposed in the insulating body. The coupling part can be locked in the insulating body.

As a result of this invention, contacting of both circuit board sides becomes possible in simple manner without holes. This is of advantage particularly for the surface mount technique because it utilizes both circuit board sides, i.e., the top side and the bottom side, for the placement of components. Otherwise in such technique, connecting the two circuit board sides is possible only through metallized holes.

This invention also prevents in a simple manner the wetting of the contact elements in the plug area, i.e., at the contact ends, with solder.

BRIEF DESCRIPTION OF THE DRAWINGS

FIG. 1 is a side view of a circuit board designed in accordance with this invention.

FIG. 2 is a top view of the circuit board according to the invention from the direction of arrow A in FIG. 2.

FIG. 3 is a detailed view of the circuit board of FIG. 1 in a section parallel to the drawing plane of FIG. 1 in the area of a connector formed on the circuit board.

FIG. 4 is a top view of the circuit board of FIG. 3 from the direction of arrow B.

FIG. 5 is a detailed view of FIG. 3.

FIG. 6 is a detailed view of the circuit board in an area similar to the one shown in FIG. 5, except for a different contacting embodiment between contact element and conductive path.

DESCRIPTION OF THE PREFERRED EMBODIMENTS

Figures 7, 9:
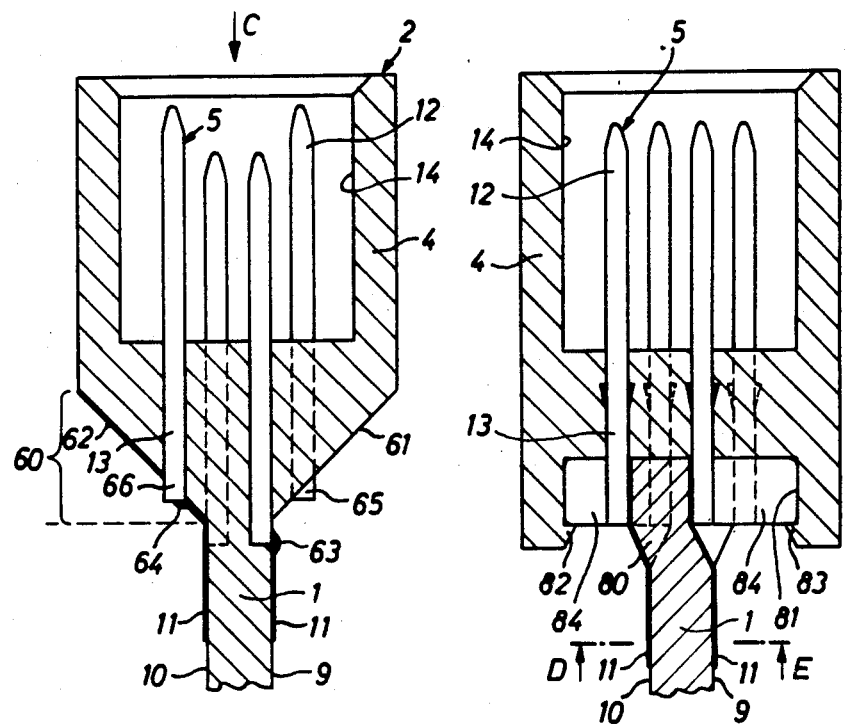
FIG. 7 is a transverse section of another embodiment example of a circuit board with a connector molded to it.
FIG. 9 is a transverse section of another embodiment example of a circuit board according to the invention in the area of the connector disposed on the circuit board.

With reference to the drawings, FIGS. 1 and 2 show a circuit board 1, consisting of a plastic material, with a connector 2 molded on adjacent to one edge of the circuit board 1. The connector 2 has an insulating body (housing) 4, there being arranged in the insulating body 4 preferably several contact elements 5. The contact elements 5 are preferably arranged in several rows (in two rows in the embodiment example shown). The design and configuration of the connector 2 are explained in detail in FIGS. 3 through 5. These Figures are now referred to in the following description of a first embodiment example of the invention.

The connector 2, or its insulating body 4, respectively, extend along the one edge of the circuit board 1 over a length corresponding to the number of conductive paths 11 to be connected. As is known, the circuit boards are equipped with conductive paths 11 which electrically connect components arranged on the circuit board, but not shown. Certain conductive paths 11 (and only they are shown) serve the purpose of being led out of the circuit board 1 via the connector 2 in order to establish the connection to other components.

In the embodiment example shown, conductor strips 11 to be led out are provided on both the top side 9 and the bottom side 10 of the circuit board 1. Although the circuit board 1 may be formed by any technique, it is preferably one made by the so-called dry additive technology.

A printed circuit board made by the dry additive process is typically aboard in which the conductive traces are made by placing grooves in a board with a die and spreading a metal conductive powder on the board. Preferably the powder is copper in the form of flakes. The powder is compressed in the grooves and heated to cause the copper to anneal into a continuous conductive trace in the grooves. The pressure and temperature are chosen to provide the desired result. Alternatively, the grooving and compressing can be done simultaneously on an ungrooved board on which the flakes are spread. Preferably, the board is made of a heat softenable thermoplastic material, such as a polyetherimide.

According to a preferred embodiment of the invention, the circuit board 1 and the connector 2 are designed as an integral part. The circuit board 1 and the connector 2 are preferably produced together by plastic injection molding methods. Other manufacturing methods may also be used.

According to the invention, the insulating body 4 (which can also be called the housing) of the connector 2 with the circuit board 1 is designed with the interposition of a connecting element 6. The connecting element 6 preferably extends over the same length (see FIG. 2) as the insulating body 4. In particular, the connecting element 6 serves the purpose of connecting the conductive paths 11 to be led out to the contact elements 5. The connecting element 6 leads the conductive paths 11 on both the top side 9 and on the bottom side 10 out of the planes respectively formed by the top and bottom sides virtually into the third dimension so that a three-dimensional circuit board results, in a manner of speaking.

Starting from this basic idea of using a connecting element 6 which is, of course, also designed as an integral part of both the insulating body 4 and the circuit board 1, the contact elements 5 can be connected to the conductive paths 11 to be led out in various ways. The possibility indicated in FIGS. 1 and 2 is described in greater detail with reference to the FIGS. 3 through 5. A special embodiment is shown in FIG. 6 and the embodiment example per FIG. 7 describes another possibility. The embodiment example per FIG. 9 differs from the other embodiment examples in that the circuit board and the insulating body are two parts.

In FIGS. 3 and 4 of the first embodiment example it may be seen that, when producing the circuit board 1, depressions or holes 24 can be molded in the bottom of the insulating body and adjacent thereto in the connecting element 6 by appropriate measures in the injection mold, to accommodate the terminal ends 13 of contact elements 5. Opposite the terminal ends 13 the contact elements 5 have contact ends 12. In the embodiment example shown the contact elements are depicted as contact blades.

It will now be first described how the conductive paths 11 to be led out on the top side 9 of the circuit board 1 are connected to the associated terminal ends 13 of the contact elements 5. The connecting element 6 forms a surface extending from the plane of the top side 9, such as by an oblique wall 15; starting at the broken line (FIGS. 1 and 2) the conductive paths 11 then extend from the top side 9 over oblique surface 15 and extend into depressions 16 separated from each other by webs 17, 18 and 19. The web or depression wall is marked 20 in FIG. 3. In the area where a hole 24 penetrates a depression 16 the conductive path 11 is practically perforated, yet sufficient contact results at 28, 29 and 30.

Preferably, the conductive path 11 may also be widened in the area of the depression 16, as shown in FIG. 4 for the conductive path 11 located on the far right. This results in no interruption whatever; also the contact at 30 becomes fully effective.

Connecting the contact elements 5 to the conductive paths 11 on the bottom side 10 is similar to the procedure for the top side 9. Again a depression 22 is provided, defined in its entirety by two oblique walls forming an angle, the one oblique wall being designated 23. A web or depression wall is designated 25. A depression 16 or 22 is provided for each conductive path 11 to be led out.

As shown in FIG. 3, the hole 24 preferably extends beyond the depression 16 to assure safe retention of the contact element 5.

Besides the possibility of improving the contact between the contact element 5 and the conductive path 11 as shown on the far right of FIG. 4, it is also possible to metallize one or both web walls 20. These metallizations are then connected to associated conductive paths 11 on the one hand and on the other hand the design is such that the terminal ends 13 engage the metallized web walls 20.

FIG. 5 in particular shows that $D_2$ (the thickness of the contact) is equal to or greater than $D_1$ (the thickness of the opening), i.e., a press fit is provided between the metallized web walls and the contact element 5. The terminal ends 13 are preferably of rectangular section.

FIG. 6, in a view similar to that of FIG. 5, shows for only one contact element 5 how the latter can be connected to a conductive path 11 in a different way in the connecting element 6. It may be seen that a cut 27 is made in the connecting element 6, into which the conductive path 11 is conducted. Similar to the embodiment example per FIG. 4, numerous cuts 27 can be made next to each other. When inserting the contact element 5 into the cuts 27 at the end of the hole, the terminal end 13 makes contact with the conductive path and establishes the electrical connection.

It should be noted with respect to the embodiment example of FIG. 1 that preferably diametrically opposite the connector 2, an apparatus front panel 3 may also be molded integrally to the circuit board 1. Furthermore, as shown, the insulating part of a peripheral connector 31 may be integrated in or molded to the molded-on apparatus front panel 3.

Another embodiment example of the invention is shown in FIG. 7. The same reference symbols as in the preceding embodiment example are used as far as possible. As before, the circuit board 1 and the insulating body 4 are produced as a single part. Again, a connecting element 60 establishes the connection between circuit board 1 and insulating part 4, making it possible to connect the terminal ends 13 to the conductive path 11. The connector 2 shown here has its contact elements 5 arranged in four rows. It may be seen that the two rows on the outside are connected to the conductive paths 11 led out of the associated planes of the top side 9 and bottom side 10, respectively. The terminal ends 13 come out of the connecting element 60 and their protruding parts 65, 66 are soldered to the associated conductive paths 11, as indicated by the soldering point 64 for one contact element 5. The connecting element 60 has two oblique surfaces 61, 62 forming an angle of approximately 135° relative to the associated top and bottom sides 9, 10.

Holes terminating adjacent to the top side 9 and bottom side 10, respectively, of the circuit board are also provided for contacting the two rows on the inside. It may be seen in the sectioned view shown that one of these holes terminates near the end of a conductive path 11 so that the connection between contact element 5 and conductive path 11 can be made by a soldering point 63. These soldering operations can be performed in one and the same operation when soldering the components in.

Figure 8:
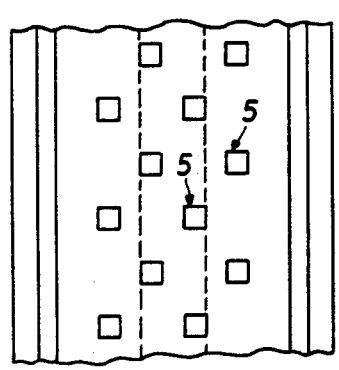
FIG. 8 is a top view of the connector terminating the circuit board from the direction of arrow C in FIG. 7.

FIG. 8 shows how the contact elements 5 are mutually offset. Finally, FIG. 7 shows that the contact ends 12 lie at a different level, minimizing the force required to plug in.

Figure 10:
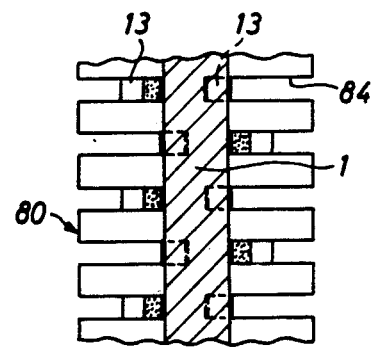
FIG. 10 schematically shows a section along line D-E in FIG. 9.

The embodiment example according to FIGS. 9 and 10 differs from the embodiment examples described heretofore inasmuch as the circuit board 1 and the insulating body 4 do not form one integral part. In this embodiment example, a coupling part 80 is molded to the circuit board 1, and this coupling part 80 in turn leads the conductive paths 11 to be led out of their associated planes defined by the top side 9 or bottom side 10. To establish the connection between the conductive paths 11 and the contact elements 5, the coupling part 80 can be snapped into a seating recess 81 in the insulating body 4, the detents 82 and 83 retaining the coupling part 80. It may be seen that the conductive paths 11 are continued into respectively associated slots 84. The arrangement is such that the terminal ends 13 of the contact elements 5 rest with good contact against the associated conductive paths 11.

The present invention is useful particularly in connection with circuit board for the surface mount technology. This invention makes possible in simple manner the connection of the connector to conductive paths on both sides of the circuit board so that both sides can be equipped with components. The integration of the connector 2 in the circuit board 1 results in a low structural height.

Particularly in the embodiment of FIGS. 3 through 6, the contact elements 5 can be inserted into the insulating part 4 after the soldering operation, i.e., after the surface mounted components are soldered on. This can be done either in a comb fashion or singly through surface mount automatic mounting machines.

If an apparatus front panel 3 per FIG. 1 is used, it can be metallized also, preferably together with the formation of the conductive paths on the circuit board 1. A direct shielding connection from the apparatus front panel 3 towards the circuit board 1 can be produced at the same time.

I claim:

1. A printed circuit board assembly comprising:
   a printed circuit board formed of plastic material, said board having an upper surface, a bottom surface, and a plurality of side edges, and a plurality of electrically conductive paths provided on at least one of said upper and bottom surfaces and adapted for providing electrical connection between electrical components which can be located at said at least one surface,
   a connector integrally formed with said printed circuit board adjacent to at least one of said side edges, said connector having a plurality of contact elements provided with contact ends and terminating ends,
   a plurality of depressions integrally formed on said at least one surface, said depressions having side edges and a bottom portion,
   a plurality of apertures in said connector, said terminating ends being received in corresponding ones of said apertures,
   said apertures extending through corresponding ones of said depressions such that the terminating ends extend through said depressions, and
   said conductive paths extending from said at least one surface into said depressions such that said terminating ends are in electrical connection in said depressions with predetermined ones of said conductive paths for providing connection to the outside of said assembly.

2. The printed circuit board assembly of claim 1, wherein said conductive paths extend into said side edges and bottom portion of said depressions.

3. The printed circuit board assembly of claim 2, wherein said depressions have a substantially V-shaped cross-section.

4. The printed circuit board assembly of claim 3, wherein said assembly has a longitudinal axis, said apertures being located in said connector such that said contact elements are substantially parallel to said longitudinal axis, and said depressions extending substantially perpendicular to the direction in which said contact elements extend.

5. The printed circuit board assembly of claim 4, wherein said conductive paths and said depressions are provided on both said upper and bottom surfaces.

6. The printed circuit board assembly of claim 5, wherein one side of each terminating end of each contact is in electrical contact with said conductive paths which extend into said side edges and an opposite side of said terminating end is in electrical contact with said conductive path adjacent to said bottom portion of said depression.

7. The printed circuit board assembly of claim 6, wherein said connector is of symmetrical design and extends symmetrically to the center line of said conductive paths.

8. The printed circuit board assembly of claim 7, wherein connectors are integrally formed along two of said side edges.

9. The printed circuit board assembly of claim 8, which said integral connectors extend longitudinally beyond said contact ends of said contact elements so that said contact elements are recessed in said connectors.

10. The printed circuit board assembly of claim 9, wherein said contact elements are press fitted into said apertures.

11. The printed circuit board assembly of claim 10, wherein said circuit board and said connectors are formed by a plastic injection molding process.

12. The printed circuit board assembly of claim 11, wherein said circuit board is formed by a dry additive process.

13. The printed circuit board assembly of claim 3, wherein said depressions are separated by webs having walls that define the lateral extent of said depressions, and at least one of said web walls of said depressions are metallized and are in electrical contact with the corresponding conductive path.

14. The printed circuit board assembly of claim 1, wherein said conductive paths and said depressions are provided on both said upper and bottom surfaces.

15. The printed circuit board assembly of claim 14, wherein said depressions have a substantially V-shaped cross-section.

16. The printed circuit board assembly of claim 15, wherein said circuit board is formed by a dry additive process.

17. The printed circuit board of assembly of claim 1, wherein said circuit board and said connector are formed by a plastic injection molding process.

18. The printed circuit board assembly of claim 17, wherein said circuit board is formed by a dry additive process.

* * * * *